United States Patent
Inoue et al.

(10) Patent No.: US 11,669,955 B2
(45) Date of Patent: Jun. 6, 2023

(54) SUBSTRATE DEFECT INSPECTION METHOD, STORAGE MEDIUM, AND SUBSTRATE DEFECT INSPECTION APPARATUS

(71) Applicant: Tokyo Electron Limited, Tokyo (JP)

(72) Inventors: Shin Inoue, Koshi (JP); Kazuya Hisano, Koshi (JP); Akiko Kiyotomi, Koshi (JP); Tadashi Nishiyama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 245 days.

(21) Appl. No.: 17/252,151

(22) PCT Filed: Jun. 10, 2019

(86) PCT No.: PCT/JP2019/022944
§ 371 (c)(1),
(2) Date: Dec. 14, 2020

(87) PCT Pub. No.: WO2019/244696
PCT Pub. Date: Dec. 26, 2019

(65) Prior Publication Data
US 2021/0166365 A1 Jun. 3, 2021

Related U.S. Application Data

(63) Continuation of application No. PCT/JP2019/022944, filed on Jun. 10, 2019.

(30) Foreign Application Priority Data

Jun. 21, 2018 (JP) .............................. JP2018-117798

(51) Int. Cl.
*G06T 7/00* (2017.01)
*G03F 7/16* (2006.01)

(52) U.S. Cl.
CPC .............. *G06T 7/001* (2013.01); *G03F 7/162* (2013.01); *G06T 7/0008* (2013.01); *G06T 2207/30148* (2013.01)

(58) Field of Classification Search
CPC ...... G03F 1/36; G03F 9/7026; G03F 7/70675; G03F 1/70; G03F 7/162; G02B 21/367; G06T 7/0004; G06T 7/001
(Continued)

(56) References Cited

U.S. PATENT DOCUMENTS

2014/0160451 A1 6/2014 Hasegawa et al.
2015/0358602 A1* 12/2015 Mayumi ............ G01N 21/8803
348/46
(Continued)

FOREIGN PATENT DOCUMENTS

| JP | H1-287449 A | 11/1989 |
|---|---|---|
| TW | 201428691 A | 7/2014 |
| TW | 201809644 A | 3/2018 |

*Primary Examiner* — Phuoc H Doan
(74) *Attorney, Agent, or Firm* — Posz Law Group, PLC

(57) ABSTRACT

Defects of substrates are inspected when executing a job in which a treatment recipe for substrates and the substrates being treatment objects are designated to perform predetermined treatments on the substrates. An imaging step successively images substrates. A first determination step decomposes, in order from the substrate as head of the job, a planar distribution of pixel values in a substrate image captured at the imaging step into pixel value distribution components using a Zernike polynomial, calculates Zernike coefficients of the pixel value distribution components corresponding to defects to be detected, and determines presence or absence of a defect based on the calculated Zernike coefficients. A second determination step determines, from predetermined timing after one or more substrates is determined to have no defect at the first determination step,
(Continued)

presence or absence of a defect based on the substrate image determined to have no defect at the first determination step.

18 Claims, 12 Drawing Sheets

(58) Field of Classification Search
USPC .......................................... 382/149; 351/206
See application file for complete search history.

(56) References Cited

U.S. PATENT DOCUMENTS

2018/0005370 A1    1/2018  Kitada et al.
2018/0321161 A1*  11/2018  Okada ....................... G06T 7/70

* cited by examiner

FIG.10

| PRIMARY COLOR | ZERNIKE COEFFICIENT | | |
|---|---|---|---|
| RGB | Z4 | Z12 | Z13 |
| R | 0.21051 | 0.71039 | 0.30047 |
| G | 0.27127 | 0.15798 | 0.12432 |
| B | 0.88629 | 0.14872 | 0.10688 |

SUBSTRATE DEFECT INSPECTION METHOD, STORAGE MEDIUM, AND SUBSTRATE DEFECT INSPECTION APPARATUS

TECHNICAL FIELD

Cross-Reference to Related Applications

This application is based upon and claims the benefit of priority of the prior Japanese Patent Application No. 2018-117798, filed in Japan on Jun. 21, 2018, the entire contents of which are incorporated herein by reference.

The present invention relates to a substrate defect inspection method, a storage medium, and a substrate defect inspection apparatus.

BACKGROUND ART

In a photolithography step in a manufacturing process of a semiconductor device, a series of treatments such as a resist coating treatment of applying a resist solution onto a wafer to form a resist film, exposure processing of exposing the resist film into a predetermined pattern, a developing treatment of developing the exposed resist film and so on are successively performed to form a predetermined pattern on the wafer. The series of treatments is performed in a coating and developing treatment system being a substrate treatment system in which various treatment parts for treating the wafer, a transfer mechanism for transferring the wafer and so on are installed.

In the developing treatment system, an inspection for a defect of the wafer is performed. In the inspection for a defect of the wafer, the presence or absence of a defect of the resist film formed by the resist coating treatment, the presence or absence of scratch and adhesion of a foreign substance to the wafer and the presence or absence of a defect in the formed resist pattern are inspected.

The inspection apparatus of Patent Document 1 is to inspect for a defect of the resist pattern, and images the wafer on which the resist pattern determined to be a good product in advance is formed, and stores it as a reference image for inspection in advance. Then, a wafer being an inspection object is imaged, the captured image is compared with the reference image, and whether the resist pattern on the wafer being the inspection object is normal is determined based on the comparison result.

PRIOR ART DOCUMENT

Patent Document

Patent Document 1: Japanese Patent Application Publication No. H1-287449

DISCLOSURE OF THE INVENTION

Problems to be Solved by the Invention

Incidentally, in the developing treatment system, a job in which a treatment recipe for the wafer and a wafer being a treatment object are designated is executed to perform treatments on the wafer, but the above reference image is not stored in advance in some cases. In this case, for example, the captured image of the head wafer in the job is regarded as the reference image. The reason why the reference image is not stored in advance but the captured image of the head wafer is used is, for example, it is very troublesome and deteriorates the productivity to produce a wafer having no defect, image the wafer, and create and store a reference image every time the treatment recipe is changed.

However, in the case of performing a defect inspection using the captured image of the head wafer in the job as a reference image, the defect of the head wafer cannot be detected. Further, when the head wafer has a defect, the defect inspection of subsequent wafers cannot be appropriately performed. Furthermore, when the number of wafers being treatment objects in the job is one, the defect inspection is not performed at all for the job.

However, the defect inspection method disclosed in Patent Document 1 does not take the above points into consideration.

The present invention has been made in consideration of the above circumstances, and its object is to make it possible to appropriately perform a defect inspection from a head substrate in a job.

Means for Solving the Problems

To solve the above problem, an aspect of the present invention is a method for inspecting defects of substrates when executing a job in which a treatment recipe for the substrates and the substrates being treatment objects are designated to perform predetermined treatments on the substrates, including: an imaging step of successively imaging the substrates; a first determination step of decomposing, in order from the substrate being a head of the job, a planar distribution of pixel values in a substrate image captured at the imaging step into a plurality of pixel value distribution components using a Zernike polynomial, calculating Zernike coefficients of the pixel value distribution components corresponding to defects to be detected, and determining presence or absence of a defect of the substrate based on the calculated Zernike coefficients; and a second determination step of determining, from predetermined timing after at least one substrate is determined to have no defect at the first determination step, presence or absence of a defect of the substrate being a determination object based on the substrate image determined to have no defect at the first determination step.

According to an aspect of the present invention, the planar distribution of the pixel values in the captured substrate image is expanded using the Zernike polynomial to calculate the Zernike coefficients corresponding to the defects to be detected, and the determination of the presence or absence of a defect of the substrate based on the calculation result is performed until a substrate determined to have no defect in the determination appears. Accordingly, defects can be detected even for a predetermined number of substrates from the head of the job. Further, even if the number of substrates being treatment objects in the job is one, the defect inspection regarding the job can be performed. Further, after the predetermined timing, the presence or absence of the defect is determined based on the substrate image determined to have no defect from the calculation result of the Zernike coefficients, so that the defect inspection of the substrates can be appropriately performed over the whole job.

According to an aspect of the present invention according to another viewpoint, there is provided a computer-readable storage medium storing a program running on a computer of a controller controlling a substrate treatment system to cause the substrate treatment system to execute the substrate defect inspection method.

The present invention according to still another viewpoint is a defect inspection apparatus for inspecting defects of substrates in a substrate treatment system executing a job in which a treatment recipe for the substrates and a number of substrates to be treated are designated to perform predetermined treatments on the substrates, including: an imager configured to image the substrates; a first determiner configured to decompose, in order from the substrate being a head of the job, a planar distribution of pixel values in a substrate image captured in the imager into a plurality of pixel value distribution components using a Zernike polynomial, calculate Zernike coefficients of the pixel value distribution components corresponding to defects to be detected, and determine presence or absence of a defect of the substrate based on the calculated Zernike coefficients; and a second determiner configured to determine from predetermined timing after at least one substrate is determined to have no defect in the first determiner, presence or absence of a defect of the substrate being a determination object based on the substrate image determined to have no defect in the first determiner.

Effect of the Invention

According to an aspect of the present invention, it is possible to appropriately perform a defect inspection from a substrate being a head of a job.

BRIEF DESCRIPTION OF THE DRAWINGS

FIG. 10 is an explanatory view expressing values of Zernike coefficients found for a plurality of wafers.

EMBODIMENTS FOR CARRYING OUT THE INVENTION

Figure 1:
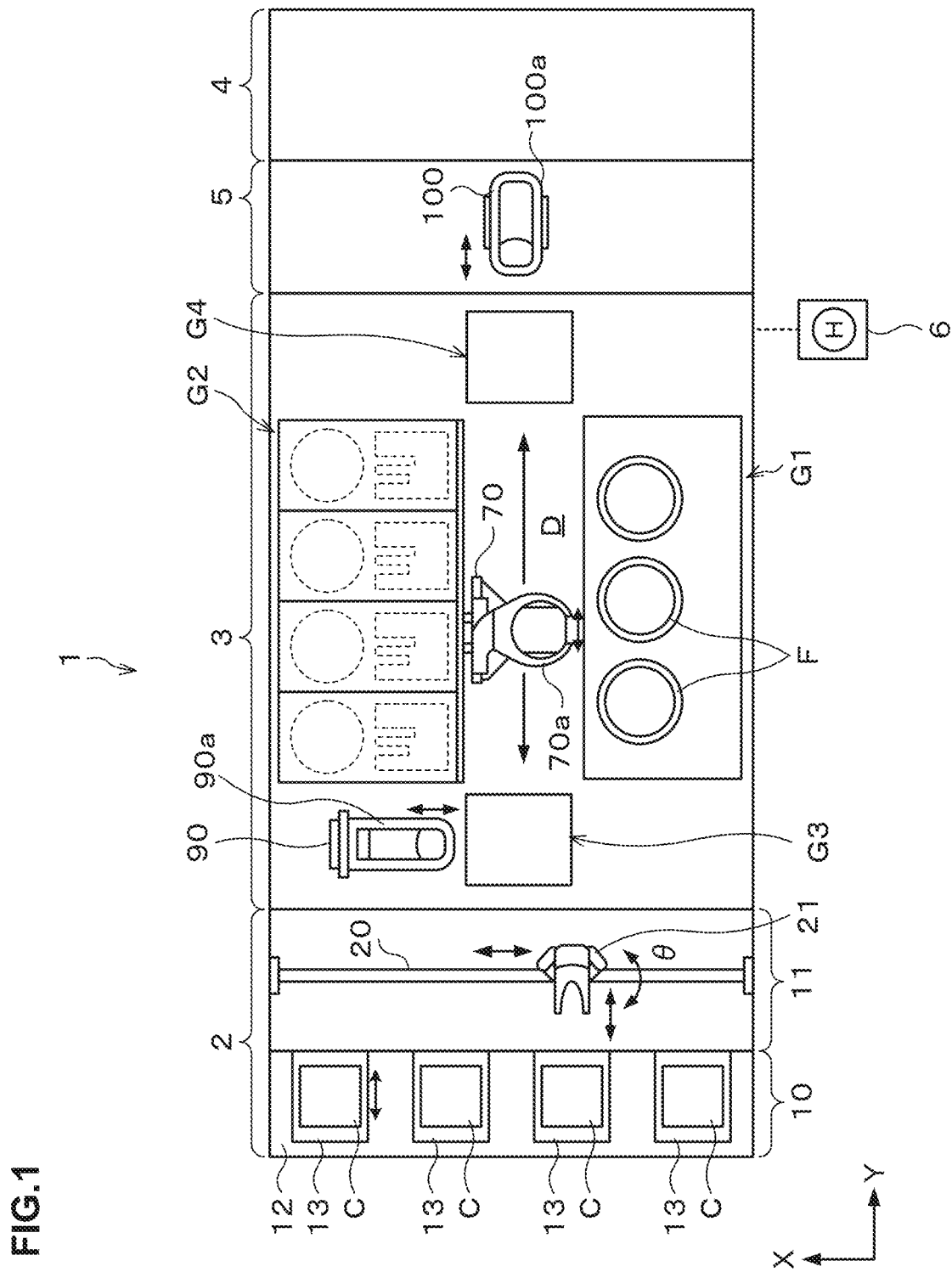
FIG. 1 is a plan view illustrating the outline of an internal configuration of a substrate treatment system according to an embodiment.

Hereinafter, an embodiment will be explained referring to the drawings. Note that the same codes are given to components having substantially the same functional configurations in the description and the drawings to omit duplicated explanation.

Figure 2:
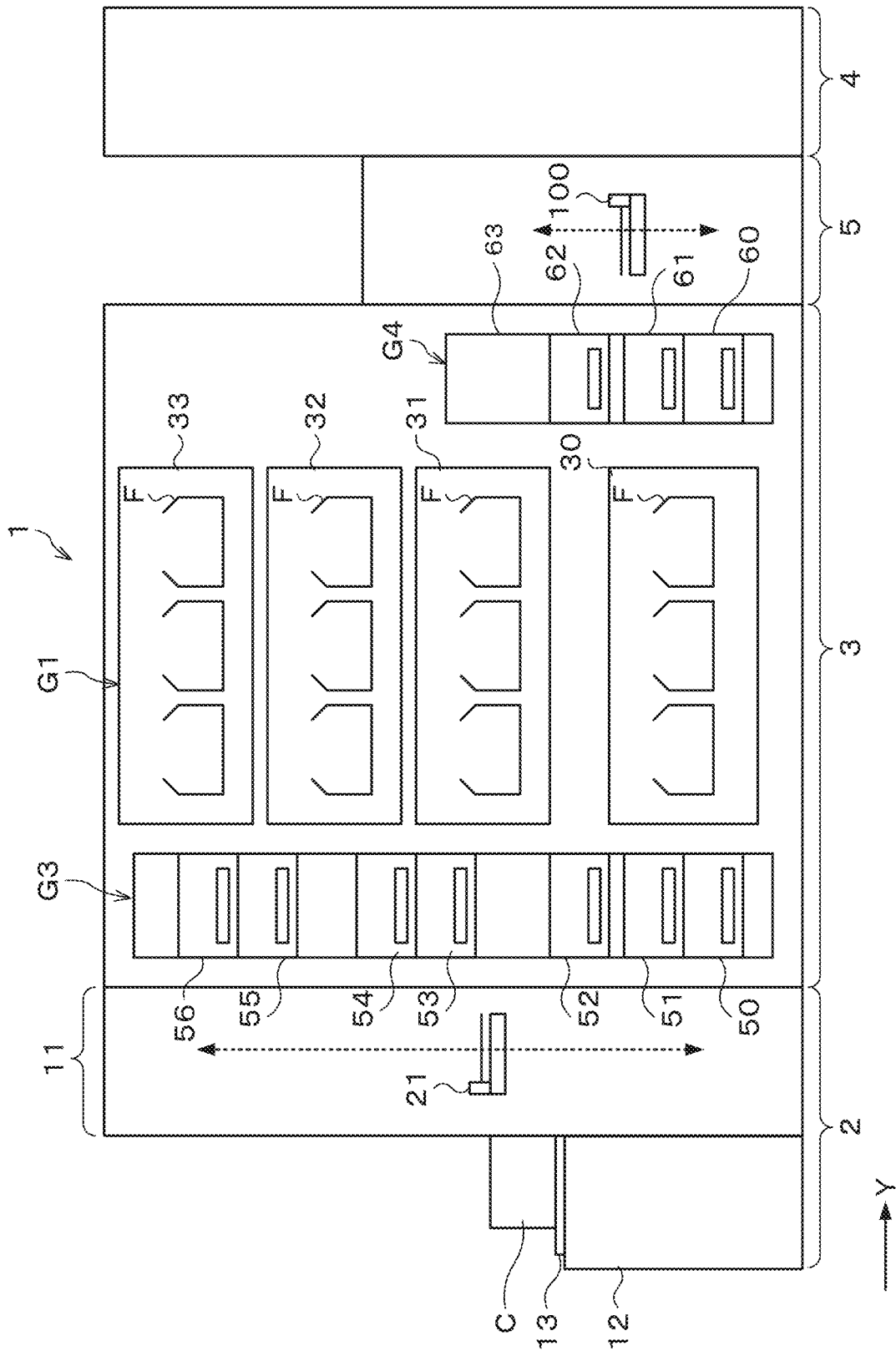
FIG. 2 is a side view illustrating the outline of the internal configuration of the substrate treatment system according to the embodiment.
Figure 3:
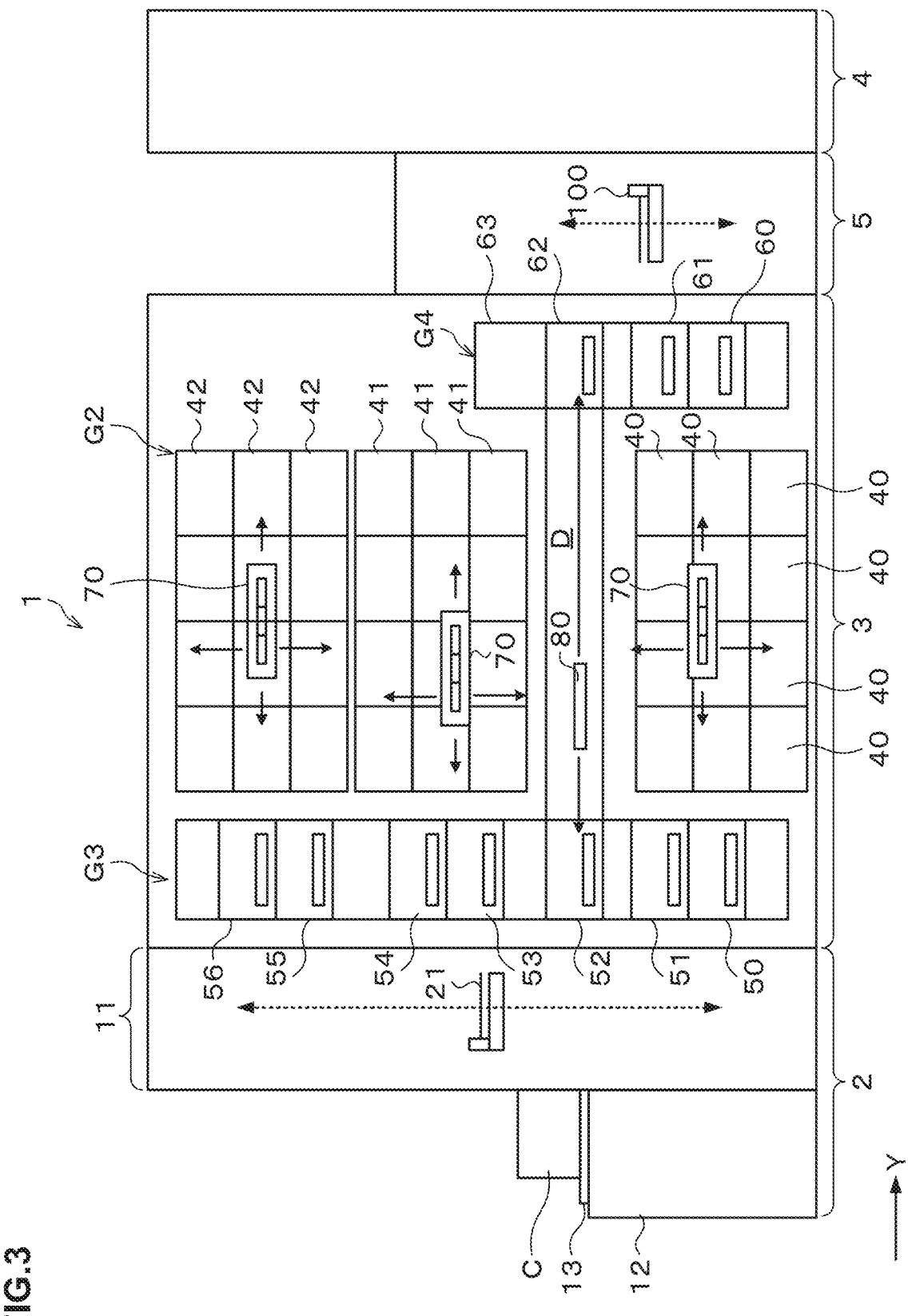
FIG. 3 is a side view illustrating the outline of the internal configuration of the substrate treatment system according to the embodiment.

FIG. 1 is an explanatory view illustrating the outline of an internal configuration of a substrate treatment system 1 including a reference image creation apparatus according to the embodiment. FIG. 2 and FIG. 3 are side views illustrating the outline of the internal configuration of the substrate treatment system 1. Note that in the embodiment, an example where the substrate treatment system 1 is, for example, a coating and developing treatment system which performs a photolithography process for a substrate will be explained.

As illustrated in FIG. 1, the substrate treatment system 1 has, for example, a configuration in which a cassette station 2 as a transfer-in/out section into/out of which a cassette C is transferred, for example, from/to the outside, a treatment station 3 as a treatment section including a plurality of various treatment apparatuses which perform predetermined treatments in a single wafer manner in the photolithography process, and an interface station 5 as a transfer section which delivers the wafer W as a substrate to/from an exposure apparatus 4 adjacent to the treatment station 3, are integrally connected. The substrate treatment system 1 further has a controller 6 which controls the substrate treatment system 1.

The cassette station 2 is divided, for example, into a cassette transfer-in/out section 10 and a wafer transfer section 11. The cassette transfer-in/out section 10 is provided, for example, at an end on a Y-direction negative direction (left direction in FIG. 1) side in the substrate treatment system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 1). On the stage plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in the up-down direction and around a vertical axis (in a θ-direction), and can transfer the wafer W between the cassette C on each of the stage plates 13 and a later-explained delivery apparatus in a third block G3 in the treatment station 3.

In the treatment station 3, a plurality of, for example, four blocks G1, G2, G3, G4 each including various apparatuses are provided. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are stacked at four stages in order from the bottom.

The solution treatment apparatuses 30 to 33 in the first block G1 have a plurality of cups F each of which houses the wafer W during treatment in a horizontal direction and can treat a plurality of wafers W in parallel.

In the second block G2, as illustrated in FIG. 3, thermal treatment apparatuses 40 each of which performs a heat treatment and a cooling treatment on the wafer W, adhesion apparatuses 41 as hydrophobic treatment apparatuses each of which performs a hydrophobic treatment on the wafer W, and edge exposure apparatuses 42 each of which exposes the outer peripheral portion of the wafer W, are provided side by side in the up-down direction and in the horizontal direction. Note that the numbers and the arrangement of the thermal treatment apparatuses 40, the adhesion apparatuses 41, and the edge exposure apparatuses 42 can also be arbitrarily selected.

In the third block G3, a plurality of delivery apparatuses 50, 51, 52, 53, 54, 55, 56 are provided in order from the bottom. Further, in the fourth block G4, a plurality of delivery apparatuses 60, 61, 62 and a defect inspection apparatus 63 are provided in order from the bottom.

A wafer transfer region D is formed in a region surrounded by the first block G1 to the fourth block G4 as illustrated in FIG. 1. In the wafer transfer region D, for example, a wafer transfer apparatus 70 is arranged.

The wafer transfer apparatus 70 has a transfer arm 70a movable, for example, in the Y-direction, the front-rear direction, the θ-direction, and the up-down direction. The wafer transfer apparatus 70 can move in the wafer transfer region D and transfer the wafer W to a predetermined apparatus in the first block G1, the second block G2, the third block G3, and the fourth block G4 located therearound. A plurality of the wafer transfer apparatuses 70 are disposed one above the other, for example, as illustrated in FIG. 3, and each of the wafer transfer apparatuses 70 can transfer the wafer W, for example, to a predetermined apparatus in each of the blocks G1 to G4, as high as the wafer transfer apparatus 70.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 1, a wafer transfer apparatus 90 is provided on the X-direction positive direction side of the third block G3. The wafer transfer apparatus 90 has a transfer arm 90a movable, for example, in the front-rear direction, the θ-direction, and the up-down direction. The wafer transfer apparatus 90 can move up and down while supporting the wafer W and transfer the wafer W to each of the delivery apparatuses in the third block 3.

In the interface station 5, a wafer transfer apparatus 100 is provided. The wafer transfer apparatus 100 has a transfer arm movable, for example, in the front-rear direction, the θ-direction, and the up-down direction. The wafer transfer apparatus 100 can transfer the wafer W to/from each of the delivery apparatuses in the fourth block G4 and the exposure apparatus 4, for example, while supporting the wafer W by the transfer arm.

Next, the configuration of the defect inspection apparatus 63 will be explained.

Figure 4:
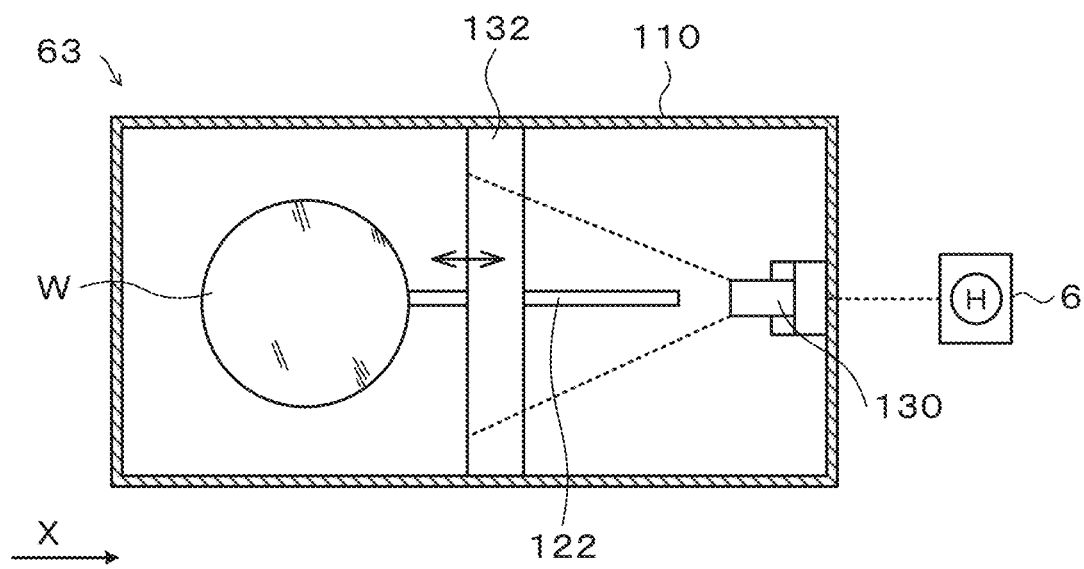
FIG. 4 is a transverse sectional view illustrating the outline of a configuration of a defect inspection apparatus.
Figure 5:
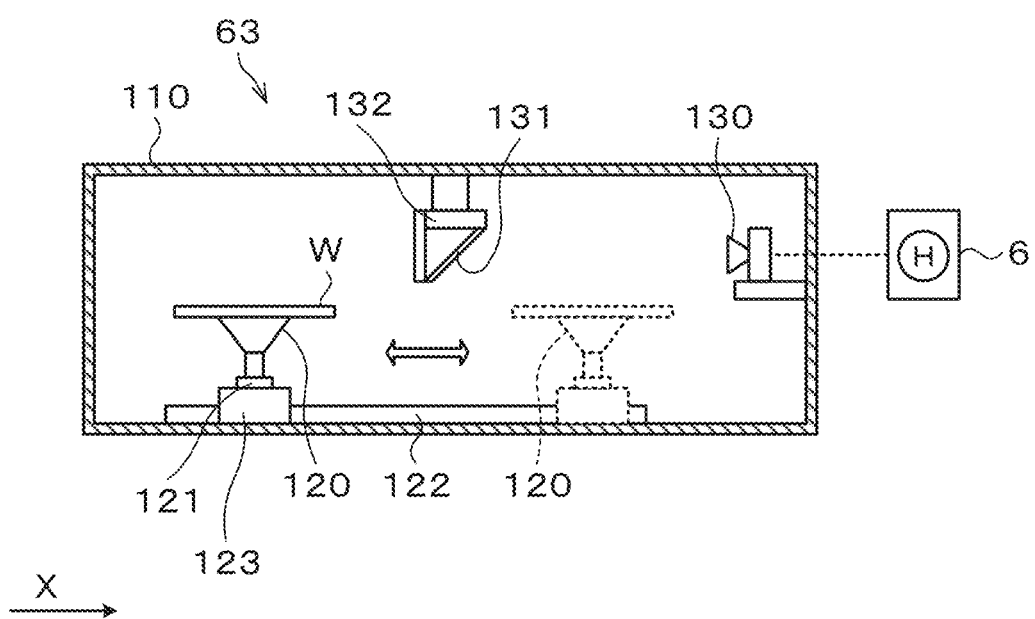
FIG. 5 is a longitudinal sectional view illustrating the outline of the configuration of the defect inspection apparatus.

The defect inspection apparatus 63 has a casing 110 as illustrated in FIG. 4. In the casing 110, a stage 120 on which the wafer W is mounted is provided as illustrated in FIG. 5. The stage 120 freely rotates and stops by a rotation drive 121 such as a motor. At a bottom surface of the casing 110, a guide rail 122 is provided which extends from one end side (an X-direction negative direction side in FIG. 5) to another end side (an X-direction positive direction side in FIG. 5) in the casing 110. The stage 120 and the rotation drive 121 are provided on the guide rail 122 and can move along the guide rail 122 by a drive 123.

On a side surface on the other end side (the X-direction positive direction side in FIG. 5) in the casing 110, an imager 130 is provided. For the imager 130, for example, a wide-angle CCD camera is used. The number of bits of the image is, for example, 8 bits (256 gradations of 0 to 255). Near the middle of the top of the casing 110, a half mirror 131 is provided. The half mirror 131 is provided at a position facing the imager 130 in such a state that its mirror surface is inclined upward at 45 degrees toward the imager 130 from a state of being directed vertically downward. Above the half mirror 131, an illuminator 132 is provided. The half mirror 131 and the illuminator 132 are fixed to the upper surface in the casing 110. The illumination from the illuminator 132 passes through the half mirror 131 and is applied downward. Accordingly, light reflected from an object existing below the illuminator 132 is further reflected from the half mirror 131 and captured into the imager 130. In other words, the imager 130 can image the object existing within an irradiation region by the illuminator 132. The captured image of the wafer W (substrate image) is input into the controller 6.

The controller 6 is composed of, for example, a computer including a CPU, a memory and so on, and includes a program storage (not illustrated). The program storage stores programs for controlling the defect inspection of the wafer W performed based on the substrate image captured in the defect inspection apparatus 63. In addition, the program storage also stores programs for controlling the operations of drive systems of, such as, the above various treatment apparatuses and transfer apparatuses so as to realize predetermined operations of the substrate treatment system 1, namely, the coating of the wafer W with the resist solution, the development, the heat treatment, the delivery of the wafer W, the control of the apparatuses and so on. Note that the controller 6 manages the treatments on the wafers W on a job (process job) basis. In each process job, a treatment recipe for the wafers W, the wafers W being objects to be treated by the treatment recipe, and so on are designated and, more specifically, the treatment recipe for the wafers W, the positions (slots) in the cassette C of the wafers W being treatment objects, and so on are designated. Further, each process job is created by an operator, for example, via an operation panel (not illustrated) and stored in the memory or the like of the controller 6. Note that the above programs may be the ones that are recorded, for example, in a computer-readable storage medium H such as a hard disk (HD), compact disk (CD), magneto-optical disk (MO), or memory card, and installed from the storage medium H into the controller 6.

Figure 6:
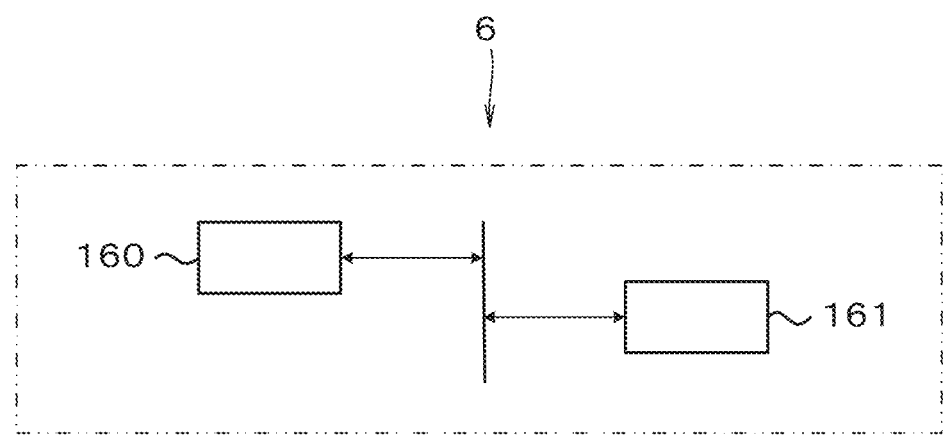
FIG. 6 is a block diagram schematically illustrating the outline of a configuration of a controller.

The controller 6 further has, as illustrated in FIG. 6, a first determiner 160 which determines the presence or absence of a defect in order from the head wafer W of the process job, and a second determiner 161 to which the determination is switched from the first determiner 160 at predetermined timing after the determination that at least one wafer W is determined to have no defect in the first determiner 160 and which determines the presence or absence of a defect for the wafers W after the switching.

The first determiner 160 decomposes a planar distribution of pixel values within the substrate image captured by the imager 130 in the defect inspection apparatus 63 into a plurality of pixel value distribution components using the Zernike polynomial for the wafer W being an inspection object. The first determiner 160 further calculates at least Zernike coefficients of pixel value distribution components corresponding to defects to be detected among the decomposed pixel value distribution components. The first determiner 160 then determines the presence or absence of a defect of the wafer W being the inspection object based on the calculated Zernike coefficients.

Note that the substrate image is generally composed of three primary colors such as RGB (Red, Green, Blue). Therefore, the pixel value distribution component Zi can be found for each of the primary colors R, G, B but there is no difference in method of image treatment among R, G, B. Accordingly, treatments are performed in parallel for all of the primary colors R, G, B in the below even in a case of not specifically stated.

Hereinafter, the first determiner 160 will be explained in detail.

Figure 7:
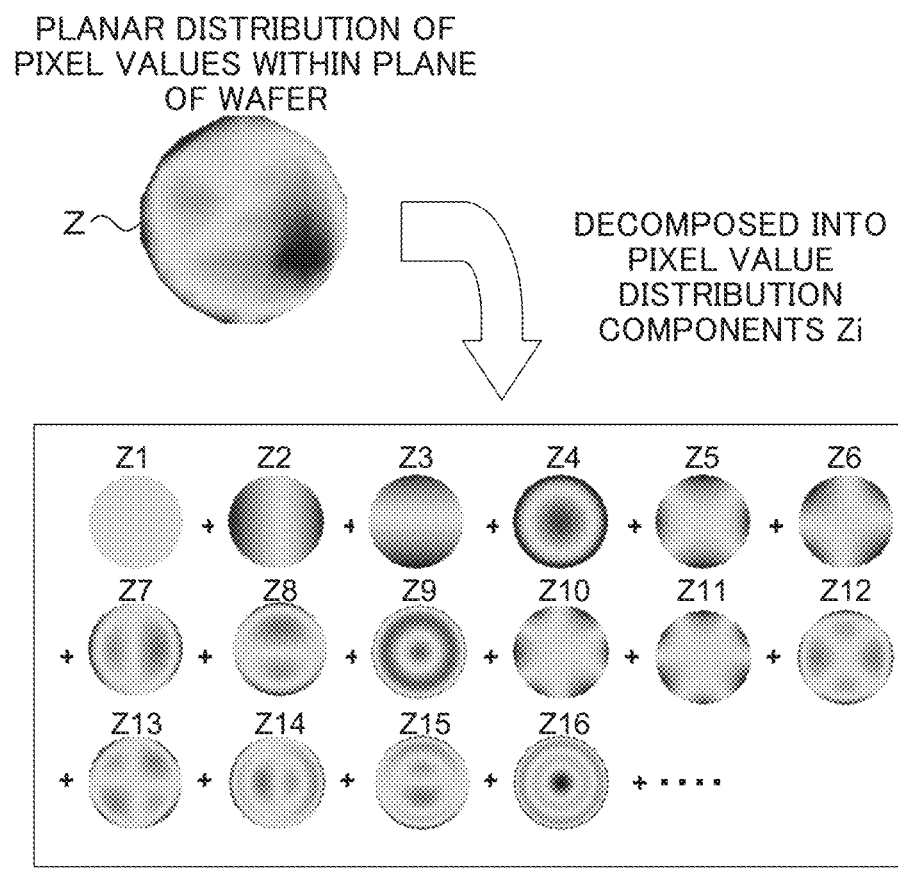
FIG. 7 is an explanatory view illustrating a state where a planar distribution of pixel values is decomposed into a plurality of pixel value distribution components using the Zernike polynomial.

The first determiner 160 first digitizes the substrate image captured by the imager 130 as pixel values, for example, in pixels over the entire surface of the wafer W for each wafer W from the head of the process job until switching to the determination in the second determiner. Thus, the planar distribution of the pixel values within the wafer plane is obtained. Then, the first determiner 160 decomposes the planar distribution of the pixel values within the wafer plane into a plurality of pixel value distribution components Zi (i is an integer of 1 or larger). The plurality of pixel value distribution components Zi are made by expressing the planar distribution Z of the pixel values within the wafer plane decomposed into a plurality of components using the Zernike polynomial as illustrated in FIG. 7.

The Zernike polynomial is explained now. The Zernike polynomial is a function of complex variable mainly used in an optical field and has two degrees (n, m). The Zernike polynomial is also a function on a unit circle having a radius of 1 and has arguments (r, θ) of polar coordinates. The Zernike polynomial is used to analyze, for example, the aberration component of a lens in the optical field, so that the aberration component based on each independent wavefront, for example, the shape of a mount, a saddle or the like can be recognized by decomposing wavefront aberration by using the Zernike polynomial.

Figure 8:
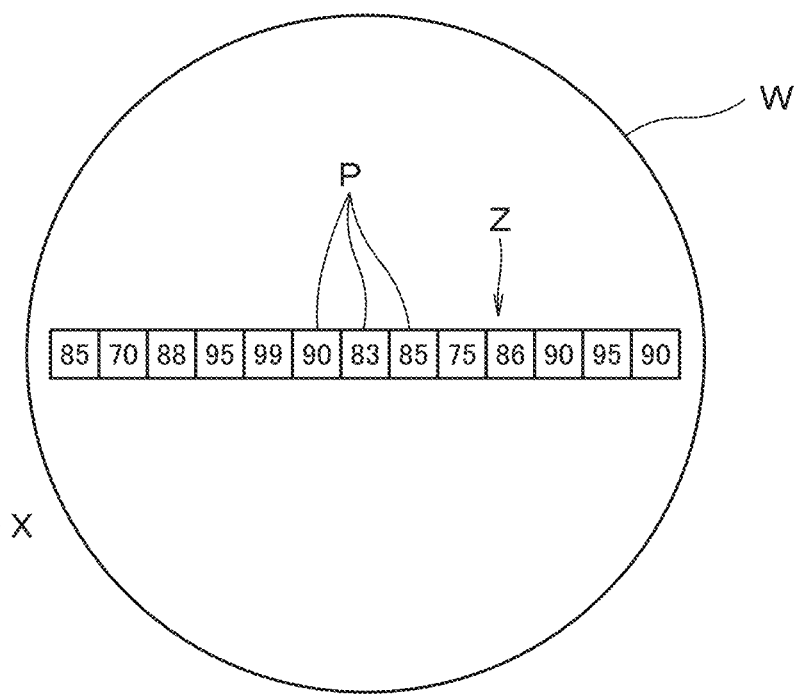
FIG. 8 is an explanatory view expressing pixel values of pixels within a plane of a wafer.
Figure 9:
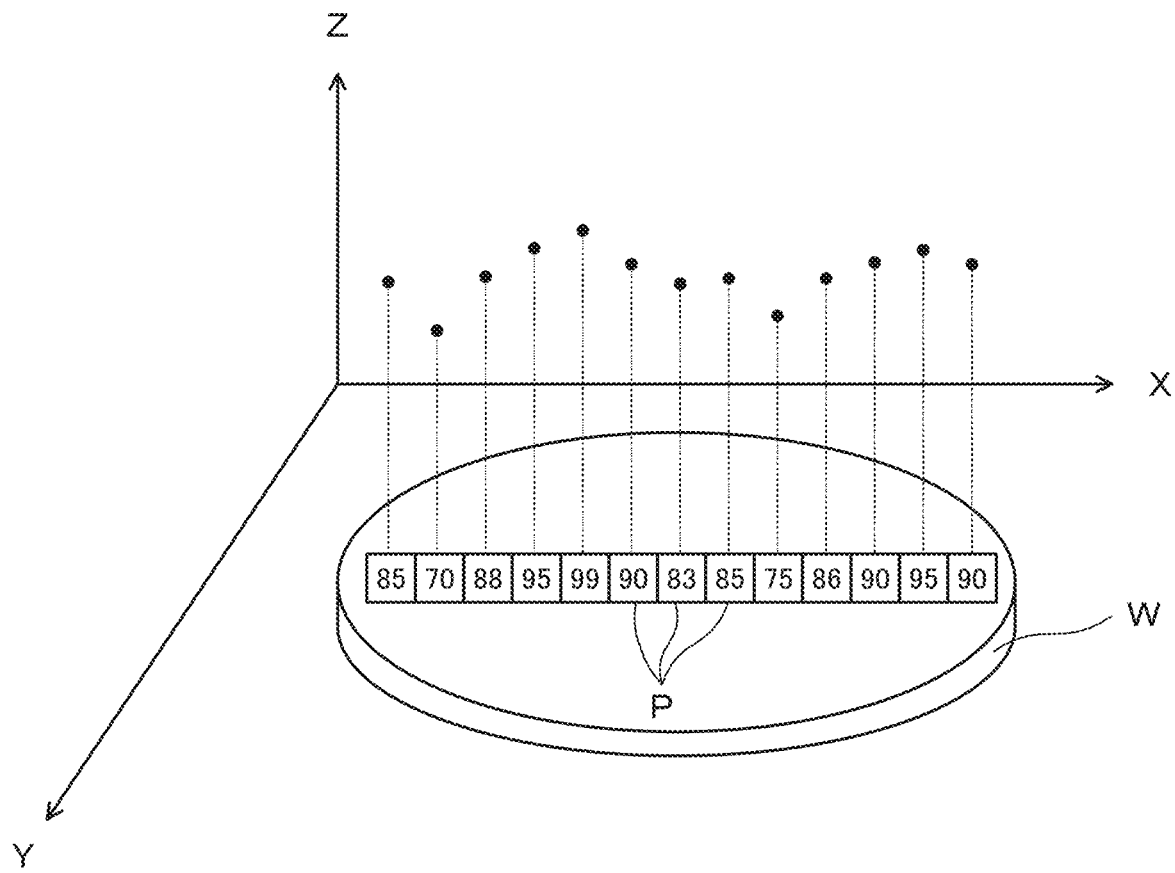
FIG. 9 is an explanatory view expressing the pixel values of the pixels within the plane of the wafer in the height direction on the plane of the wafer.

Next, a procedure of finding the pixel value distribution component Zi using the Zernike polynomial in the embodiment will be explained using FIG. 8 and FIG. 9. FIG. 8 expresses the planar distribution Z of the pixel values of pixels P within the plane of the wafer W, in which the numeric value indicated inside each pixel P represents the pixel value of the pixel P. Note that, for easy explanation, only pixels P in a row along an X-axis direction are illustrated in FIG. 8 and FIG. 9. When applying the Zernike polynomial to the planar distribution Z of the pixel values illustrated in FIG. 8, the pixel values of the pixels P are expressed in the height direction on the plane of the wafer W (in a Z-direction positive direction in FIG. 9) as illustrated, for example, in FIG. 9. As a result, the planar distribution of the pixel values of the pixels P can be grasped as a curve in a predetermined shape drawn in three dimensions. Further, the pixel values of all of the pixels P within the plane of the wafer W are similarly expressed in the height direction on the plane of the wafer W, whereby the distribution of the pixel values within the plane of the wafer W can be grasped as a circular wavefront in three dimensions. Grasping the distribution as the wavefront in three dimensions in this manner makes it possible to apply the Zernike polynomial, and to decompose the planar distribution Z of the pixel values within the plane of the wafer, for example, into a plurality of pixel value distribution components Zi such as gradient components in the right, left, top and bottom directions within the wafer plane, curvature components curved in a convex shape or a concave shape and so on using the Zernike polynomial. The magnitude of each of the pixel value distribution components Zi can be expressed by the Zernike coefficient.

The Zernike coefficient representing each of the pixel value distribution components Zi can be concretely expressed by using arguments (r, θ) of polar coordinates and degrees (n, m). The Zernike coefficients of a first term to a thirteenth term are listed below as examples.

$Z1$, $n=0$, $m=0$ (1)
$Z2$, $n=1$, $m=1$ ($r \cdot \cos \theta$)
$Z3$, $n=0$, $m=-1$ ($r \cdot \sin \theta$)
$Z4$, $n=2$, $m=0$ ($2r^2-1$)
$Z5$, $n=2$, $m=2$ ($r^2 \cdot \cos 2\theta$)
$Z6$, $n=2$, $m=-2$ ($r^2 \cdot \sin 2\theta$)
$Z7$, $n=3$, $m=1$ ($(3r^3-2r) \cdot \cos \theta$)
$Z8$, $n=3$, $m=-1$ ($(3r^3-2r) \cdot \sin \theta$)
$Z9$, $n=4$, $m=0$ ($6r^4-6r^2+1$)
$Z10$, $n=3$, $m=3$ ($r^3 \cdot \cos \theta$)
$Z11$, $n=3$, $m=-3$ ($r^3 \cdot \sin \theta$)
$Z12$, $n=4$, $m=2$ ($(4r^4-3r^2) \cdot \cos \theta$)
$Z13$, $n=4$, $m=-2$ ($(4r^4-3r^2) \cdot \sin \theta$)

.
.
.

In the embodiment, for example, the Zernike coefficient Z1 being the Zernike coefficient of the first term means the average value of the pixel values within the wafer plane, the second Zernike coefficient Z2 means the gradient component in the right-left direction of the pixel values within the wafer plane, the third Zernike coefficient Z3 means the gradient component in the front-rear direction (a direction perpendicular to the direction of the gradient of the second Zernike coefficient Z2) of the pixel values within the wafer plane, and the fourth Zernike coefficient means the curvature component of the pixel values uniform in the circumferential direction with the center of the wafer as the origin and gradually increasing in the radial direction. Further, the twelfth Zernike coefficient means the curvature component of the pixel values periodically increasing or decreasing in the form of cos θ in the circumferential direction with the center of the wafer as the origin, and having a highest absolute value at the outmost circumference and a second highest absolute value between the origin and the outmost circumference in the radial direction. The thirteenth Zernike coefficient means the curvature component of the pixel values periodically increasing or decreasing in the form of sin θ in the circumferential direction with the center of the wafer as the origin, and having a highest absolute value at the outmost circumference and a second highest absolute value between the origin and the outmost circumference in the radial direction.

The first determiner 160 further calculates the values of the pixel value distribution components Zi corresponding to the defects to be detected. For example, if the defect inspection in the embodiment is the inspection for a defect of the resist film before exposure, the magnitudes of the pixel value distribution components Zi can be expressed by the Zernike coefficients as explained above, and the defects to be detected as the defect of the resist film before exposure correspond to the pixel value distribution components of the fourth term, the twelfth term, and the thirteenth term. Therefore, the first determiner 160 calculates the values of the pixel value distribution components Zi corresponding to the defects to be detected by finding the values of the Zernike coefficients Z4, Z12, Z13 of the fourth term, the twelfth term, and the thirteenth term, for example, as illustrated in FIG. 10.

Then, the first determiner 160 determines the presence or absence of a defect of the wafer W being an inspection object based on the calculated Zernike coefficients. For example, the first determiner 160 determines the presence or absence of a defect of the wafer W being the inspection object based on whether the calculated Zernike coefficients Z4, Z12, Z13 exceed threshold values. More specifically, when any of the Zernike coefficients Z4, Z12, Z13 in any of RGB exceeds the threshold value, it is determined that there is a defect in the resist film of the wafer W being an inspection object, whereas when none of the Zernike coefficients Z4, Z12, Z13 exceeds the threshold values, it is determined that there is no defect.

Next, the second determiner 161 will be explained.

The switching from the determination in the first determiner 160 to the determination in the second determiner 161 is made at predetermined timing after the determination that at least one substrate has no defect in the first determiner 160 as explained above. The predetermined timing is, for example, timing when the first determiner 160 determines for the first time that there is no defect.

Further, the second determiner 161 determines the presence or absence of a defect of the wafer W being a determination object based on the substrate image of the wafer W determined to have no defect in the first determiner 160.

More specifically, the second determiner 161 first sets the substrate image of the wafer W determined to have no defect in the first determiner 160, as a substrate image (reference image) being a reference for defect determination in the second determiner 161. For example, in the case where there are a plurality of wafers W determined to have no defect in the first determiner 160, the substrate images of the wafers W are synthesized together to create one reference image. Then, the second determiner 161 compares the above reference image and the substrate image of the wafer W being a determination object, and determines the presence or absence of a defect based on whether the substrate image falls within the allowable value from the reference image. More specifically, the second determiner 161 determines that there is no defect when the difference between the pixel value in each pixel of the substrate image and the pixel value in each pixel of the reference image falls within an allowable range. The second determiner 161 further determines that there is a defect when pixels each having a difference in pixel value not falling within the allowable range exist in a predetermined range or over.

Note that the controller 6 may have an output and display (not illustrated) for outputting and displaying the substrate image, the reference image, and so on.

The substrate treatment system 1 according to the embodiment is configured as above, and executes the process job to perform predetermined treatments on the wafer W. Next, the treatments on the wafer W performed in the substrate treatment system 1 configured as above will be explained.

In the treatments on the wafer W, first, the cassette C housing a plurality of wafers W is mounted on a predetermined stage plate 13 in the cassette transfer-in/out section 10. Then, the wafers W in the cassette C are successively taken out by the wafer transfer apparatus 21 and transferred, for example, to the delivery apparatus 53 in the third block G3 in the treatment station 3.

Next, the wafer W is transferred by the wafer transfer apparatus 70 to the thermal treatment apparatus 40 in the second block G2 and temperature-regulated. The wafer W is thereafter transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and subjected to a heat treatment. The wafer W is then returned to the delivery apparatus 53 in the third block G3.

Next, the wafer W is transferred by the wafer transfer apparatus 90 to the delivery apparatus 54 in the same third block G3. Thereafter, the wafer W is transferred by the wafer transfer apparatus 70 to the adhesion apparatus 41 in the second block G2 and subjected to a hydrophobic treatment. Thereafter, the wafer W is transferred by the wafer transfer apparatus 70 to the resist coating apparatus 32, in which a resist film is formed on the wafer W. Thereafter, the wafer W is transferred by the wafer transfer apparatus 70 to the thermal treatment apparatus 40 and subjected to a prebaking treatment. The wafer W is then transferred by the wafer transfer apparatus 70 to the delivery apparatus 55 in the same third block G3.

Next, the wafer W is transferred by the wafer transfer apparatus 70 to the upper anti-reflection film forming apparatus 33, in which an upper anti-reflection film is formed on the wafer W. The wafer W is then transferred by the wafer transfer apparatus 70 to the thermal treatment apparatus 40 and heated and temperature-regulated. The wafer W is then transferred to the edge exposure apparatus 42 and subjected to edge exposure processing.

Thereafter, the wafer W is transferred by the wafer transfer apparatus 70 to the delivery apparatus 56 in the third block G3.

Next, the wafer W is transferred by the wafer transfer apparatus 90 to the delivery apparatus 52 and transferred by the shuttle transfer apparatus 80 to the delivery apparatus 62 in the fourth block G4. The wafer W is then transferred by the wafer transfer apparatus 100 to the defect inspection apparatus 63.

In the defect inspection apparatus 63, the imager 130 images the wafer W. Then, the first determiner 160 decomposes the substrate image of the wafer W into a plurality of pixel value distribution components Zi using the Zernike polynomial. Then, the first determiner 160 calculates the Zernike coefficients Z4, Z12, Z13 of pixel value distribution components of the fourth term, the twelfth term, and the thirteenth term corresponding to the defects to be detected for each of RGB. Thereafter, the first determiner 160 determines the presence or absence of a defect of the wafer W based on whether any of the Zernike coefficients Z4, Z12, Z13 in any of RGB exceeds the threshold value.

If it is determined that there is a defect, the wafer is not subjected to the subsequent exposure processing and so on but is transferred by the wafer transfer apparatus 70 to the delivery apparatus 50 in the third block G3, and then transferred by the wafer transfer apparatus 21 in the cassette station 2 to the cassette C on the predetermined stage plate 13. When the number of wafers W designated in the process job is one, the treatments relating to the process job is ended, whereas when the number of wafers W is plural, the same treatments as above are performed on a new wafer W. Note that in the case where it is determined that there is a defect successively in a predetermined number of wafers W from the head of the process job as a result of the determination in the first determiner 160, the subsequent treatments relating to the process job may be stopped. The predetermined number is set, for example, by the operator via the operation panel (not illustrated), and stored in the memory or the like of the controller 6.

On the other hand, it is determined that there is no defect as the result of the determination in the first determiner 160, the wafer W is transferred by the wafer transfer apparatus 100 in the interface station 5 to the exposure apparatus 4 and subjected to exposure processing. The wafer W is then transferred by the wafer transfer apparatus 100 to the delivery apparatus 60 in the fourth block G4. Then, the wafer W is transferred by the wafer transfer apparatus 70 to the thermal treatment apparatus 40 and subjected to a post-exposure baking treatment. The wafer W is thereafter transferred by the wafer transfer apparatus 70 to the developing treatment apparatus 30 and developed. After the developing treatment ends, the wafer W is transferred by the wafer transfer apparatus 90 to the thermal treatment apparatus 40 and subjected to a post-baking treatment.

Thereafter, the wafer W is transferred by the wafer transfer apparatus 70 to the delivery apparatus 50 in the third block G3, and then transferred by the wafer transfer apparatus 21 in the cassette station 2 to the cassette C on the predetermined stage plate 13. Thus, a series of photolithography processes is finished.

Further, the above series of photolithography processes is repeatedly performed until the process job is ended. However, after it is once determined that there is no defect in the first determiner 160, the determination of the presence or absence of a defect is performed by the second determiner 161.

Test Examples

A test was conducted about whether the defect inspection can be appropriately performed by the determination of the presence or absence of a defect based on whether the Zernike coefficients Z4, Z12, Z13 exceed the threshold values by the first determiner 160.

Figure 11:
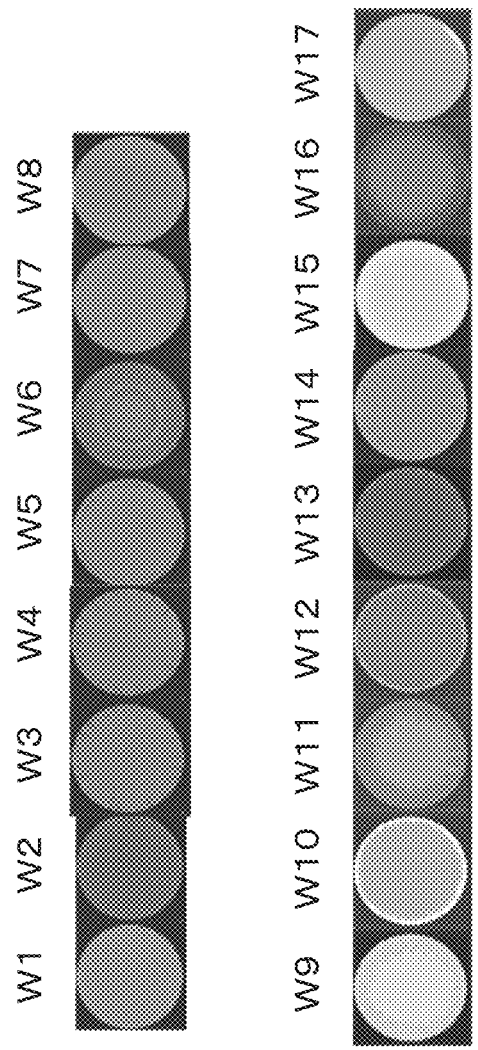
FIG. 11 is a chart illustrating substrate images used in a test example.

For the test, first to seventeenth substrate images illustrated in FIG. 11 being typical captured images of the resist films before exposure were used. First and second substrate images W1, W2 are captured images of wafers having no defect which have pixels value almost uniform within the plane, and the second substrate image W2 is more bluish than the first substrate image W1. On the other hand, the third to seventeenth substrate image W3 to W17 are captured images of wafers each having a defect.

The third, fourth and ninth to fourteenth substrate images W3, W4, W9 to W14 each have color unevenness in a slit shape extending from the outer peripheral edge to the inside in the radial direction or color unevenness in a whisker shape extending in the radial direction from the inside to the outside.

The third and fourth substrate images W3, W4 are each reddish gray as a whole of the wafer and have color unevenness in a blue slit shape formed at the outer peripheral edge.

The ninth substrate image W9 is white at the central portion and gray at the outside, and has color unevenness in a white whisker shape extending from the white central portion to the outside.

The tenth substrate image W9 is purple at the central portion and white at the outer peripheral edge, and has color unevenness in a white slit shape extending from the purple outer peripheral edge portion to the center side.

The eleventh substrate image W11 is light blue at the central portion and dark gray at the outside, and has color unevenness in a light blue whisker shape extending from the light blue central portion to the outside.

The twelfth substrate image W12 is blue at the central portion and orange at the outer peripheral edge, and has color unevenness in an orange slit shape extending from the orange outer peripheral edge portion to the center side.

The thirteenth substrate image W13 is purple as a whole of the wafer, and has color unevenness in a light blue slit shape formed at the outer peripheral edge.

The fourteenth substrate image W14 is reddish gray as a whole of the wafer, and has large pink slits formed at the outer peripheral edge.

The fifth to seventh, fifteenth, and sixteenth substrate images W5 to W7, W15, W16 each have color unevenness in an annular shape.

The fifth substrate image W5 has color unevenness in a plurality of annular shapes at the outer peripheral portion.

The sixth substrate image W6 has color unevenness in a plurality of annular shapes near the center.

The seventh substrate image W7 has color unevenness in an annular shape in a single color at the outer peripheral portion, and is reddish gray at the central portion and light blue at the outer peripheral portion.

The fifteenth substrate image W15 has color unevenness in an annular shape in a single color at the outer peripheral portion, and is gray at the central portion and white at the outer peripheral portion.

The sixteenth substrate image W16 has color unevenness in an annular shape in a single color at the outer peripheral portion, and is blue at the central portion and dark blue at the outer peripheral portion.

Note that the eighth substrate image W8 is reddish gray as a whole of the wafer in which the central portion in the right-left direction is darker in color than the other portion. The seventeenth substrate image W17 is pale purple as a whole and has white color unevenness at the lower right portion at the outer peripheral edge.

Figure 12:
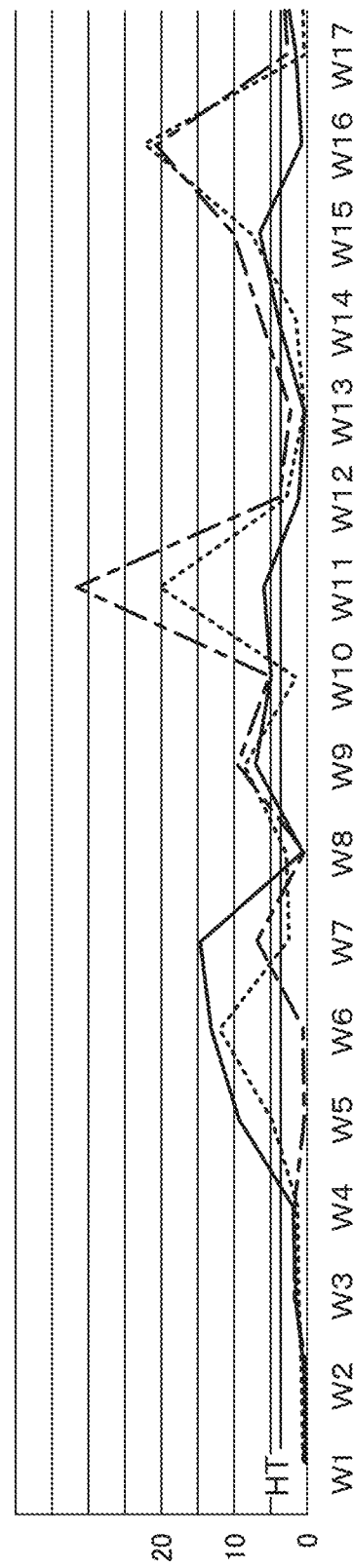
FIG. 12 is a chart illustrating a result of the test example.
Figure 13:
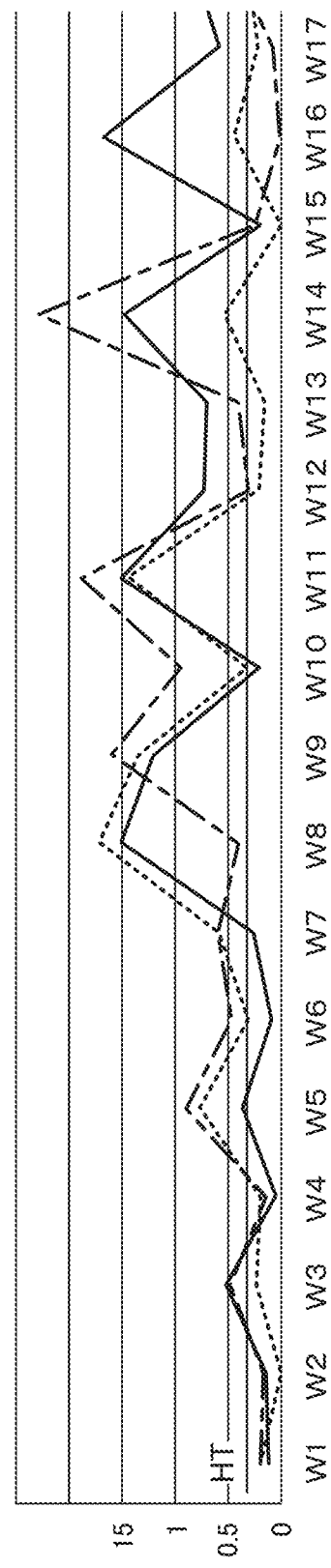
FIG. 13 is a chart illustrating a result of the test example.
Figure 14:
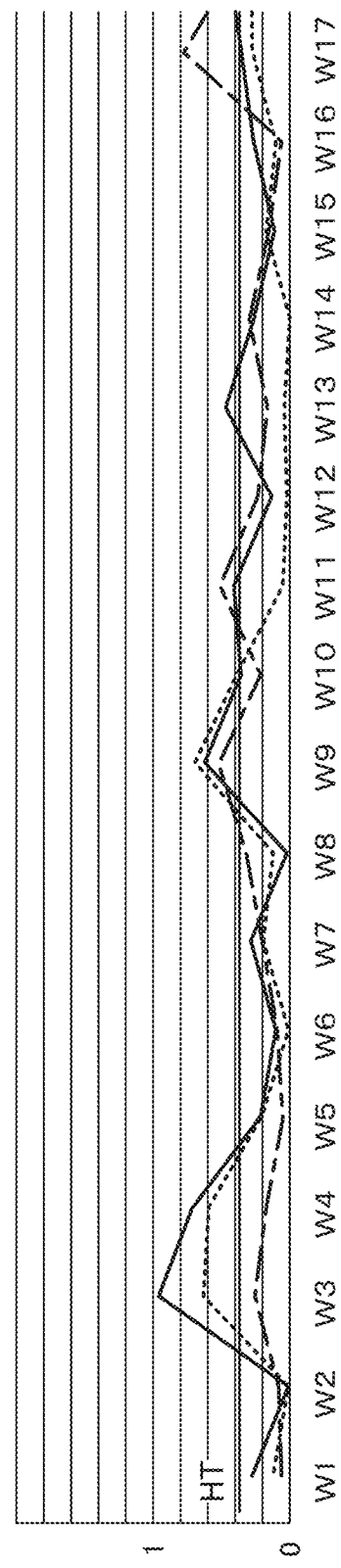
FIG. 14 is a chart illustrating a result of the test example.

FIG. 12 is a chart illustrating the relation between the Zernike coefficients Z4 of the first to seventeenth substrate images W1 to W17 and the threshold value, FIG. 13 is a chart illustrating the relation between the Zernike coefficients Z12 of the first to seventeenth substrate images W1 to W17 and the threshold value, and FIG. 14 is a chart illustrating the relation between the Zernike coefficients Z13 of the first to seventeenth substrate images W1 to W17 and the threshold value.

As illustrated in FIG. 12 to FIG. 14, the Zernike coefficients Z4, Z12, Z13 of the first and second substrate images W1, W2 were less than the threshold values about any of RGB. On the other hand, the Zernike coefficients Z4, Z12, Z13 of the third to seventeenth substrate images W3 to W17 were equal to or more than the threshold values about at least one of RGB.

This result shows that an appropriate defect inspection is possible by the determination performed, by the first determiner 160, of the presence or absence of a defect based on whether the Zernike coefficients Z4, Z12, Z13 exceed the threshold values.

According to the embodiment, until switching to the determination in the second determiner 161 from the head wafer W of the process job, the planar distribution of the pixel values in the captured substrate image is expanded for each wafer W using the Zernike polynomial to calculate the Zernike coefficients Z4, Z12, Z13 corresponding to the defects to be detected, and the presence or absence of a defect of the wafer W is determined based on the calculation result. Therefore, even for the head wafer W of the process job, a defect can be detected. Further, even when the number of wafers W being treatment objects in the process job is one, the defect inspection relating to the process job can be performed. Further, after the switching to the second determiner 161, the reference image is set based on the substrate image determined to have no defect from the calculation result of the Zernike coefficients, and the presence or absence of a defect of the wafer W being a determination object is determined based on the reference image. Therefore, it is possible to appropriately perform a defect inspection of the wafers over the whole process job.

Note that there is a case where when the imager 130 captures an image, a substrate image gradually changing in color shading in the right-left direction or the front-rear direction within a plane is obtained. For example, in the case where when the wafer W is heated and thermally treated on the hot plate of the thermal treatment apparatus 40 after the application of the resist, the wafer W runs on a structure other than the hot plate and the wafer W therefore does not come into uniform contact with the hot plate, the thickness of the resist film becomes nonuniform within a plane, resulting in the above substrate image. To extract the wafer W from which the above substrate image is obtained as the one having a defect, the Zernike coefficient Z2 and/or the Zernike coefficient Z3 in addition to or in place of the Zernike coefficients Z4, Z12, Z13 may be calculated from the planar distribution of the pixel values in the substrate image, and the presence or absence of a defect of the wafer W may be determined based on the calculation result.

In the above example, the switch timing to the determination in the second determiner 161 is the timing when the first determiner 160 determines for the first time that there is no defect, and the substrate image of the wafer W determined to have no defect in the first determiner 160 is used as the reference image used for the determination in the second determiner 161.

Instead of the above, the switch timing may be timing when the determination in the first determiner 160 is completed for a predetermined number of wafers W. Then, when the number of wafers W determined to have no defect in the first determiner 160 is one, the substrate image may be set as the reference image, whereas when the number of wafers W is plural, an image made by synthesizing the substrate images of the wafers W may be set as the reference image. Further, when the number of wafers W determined to have no defect in the first determiner 160 is plural, the substrate image having the largest differences between each Zernike coefficients and the threshold values (having, for example, the largest average of difference values) may be set as the reference image.

Note that the substrate images of the wafers W determined to have no defect in the first determiner 160 and the substrate images of the wafers W determined to have no defect in the second determiner 161 may be synthesized as the reference image. Further, the substrate image having the largest differences between the Zernike coefficients and the threshold values may be set as the reference image as in the above from among the substrate images of the wafers W determined to have no defect in the first determiner 160 and the substrate images of the wafers W determined to have no defect in the second determiner 161.

In the above example, the defect inspection is performed on the wafer W after the formation of the resist film and before exposure. In addition to or in place of the above, for example, the defect inspection of the wafer after exposure and before development, namely, the defect inspection of the resist pattern after development may be performed. The defect inspection of the resist pattern after development may be performed by the same procedure as that of the defect inspection of the wafer W before exposure. However, if the defect to be detected in the defect inspection of the resist pattern after development is different from that in the defect inspection of the wafer W before exposure, the presence or absence of the defect may be determined based on the Zernike coefficient different from the Zernike coefficients Z4, Z12, Z13 used in the defect inspection of the wafer W before exposure.

Note that the threshold value used for the determination of the presence or absence of the defect in the first determiner 160 may be manually set by the operator via the operation panel (not illustrated) or may be previously set, and may be automatically set. In the case where the threshold value is automatically set, the threshold value is set, for example, based on the Zernike coefficient about the past substrate image determined to have no defect and, more specifically, for example, a value which is 1.5 times the average value of the Zernike coefficient about the past substrate image determined to have no defect is set as the threshold value.

Besides, the "allowable range" used for the determination of the presence or absence of the defect in the second determiner 161 may be fixed, but may be changed according to the difference between the Zernike coefficient used when determining the presence or absence of the defect in the first determiner 160 and the threshold value. For example, when the difference between the Zernike coefficient of the reference image and the threshold value is large, the allowable range of the difference between the pixel value in each pixel of the substrate image and the pixel value in each pixel of the reference image in the second determiner 161 is used without correction, whereas when the above difference is small, the allowable range may be used after correction. Specifically, the above allowable range that is originally −10 to +10 may be corrected to a range of −17 to +3 when the above difference of the Zernike coefficient is 3 (the Zernike coefficient of the reference image is +7).

Besides, instead of correcting the allowable range in the second determiner 161 according to the difference between the Zernike coefficient of the reference image and the threshold value, the reference image used in the second determiner 161 may be corrected according to the above difference. For example, when the difference between the Zernike coefficient and the threshold value is small, the pixel values of the reference image may be corrected to become small as a whole. Besides, a lower limit allowable value is set separately from the threshold value, and when the Zernike coefficient of the reference image is close to the lower limit allowable value, the pixel values of the reference image may be corrected to become large as a whole.

By correcting the allowable range and the reference image as in the above, the defect can be more appropriately detected.

The embodiment disclosed herein is an example in all respects and should not be considered to be restrictive. The above embodiment may be abbreviated, replaced, or changed in various forms without departing from the scope and spirit of the attached claims. The imaging object in the above embodiment is the front of the substrate, but the present invention is also applicable to the case of imaging the rear surface of the substrate. Further, the above embodiment is an example in the coating and developing treatment system for the semiconductor wafer, but the present invention is also applicable to the case of a coating and developing treatment system for substrates other than the semiconductor wafer, such as an FPD (flat display panel), a mask reticule for a photomask and so on.

EXPLANATION OF CODES 1 substrate treatment system
2 cassette station
3 treatment station
4 exposure apparatus
5 interface station
6 controller
10 cassette transfer-in/out section
11 wafer transfer section
12 cassette stage
13 stage plate
20 transfer path
21 wafer transfer apparatus
30 developing treatment apparatus
31 lower anti-reflection film forming apparatus
32 resist coating apparatus
33 upper anti-reflection film forming apparatus
40 thermal treatment apparatus
41 adhesion apparatus
42 edge exposure apparatus
63 defect inspection apparatus
70 wafer transfer apparatus
80 shuttle transfer apparatus
90 wafer transfer apparatus
100 wafer transfer apparatus
110 casing
120 stage
121 rotation drive
122 guide rail
123 drive
130 imager
131 half mirror
132 illuminator
160 first determiner
161 second determiner
W wafer
D wafer transfer region
C cassette

What is claimed is:

1. A method for inspecting defects of substrates when executing a job in which a treatment recipe for the substrates and the substrates being treatment objects are designated to perform predetermined treatments on the substrates, the substrate defect inspection method comprising:
    an imaging step of successively imaging the substrates;
    a first determination step of decomposing, in order from the substrate being a head of the job, a planar distribution of pixel values in a substrate image captured at the imaging step into a plurality of pixel value distribution components using a Zernike polynomial, calculating Zernike coefficients of the pixel value distribution components corresponding to defects to be detected, and determining presence or absence of a defect of the substrate based on the calculated Zernike coefficients; and
    a second determination step of determining, from predetermined timing after at least one substrate is determined to have no defect at the first determination step, presence or absence of a defect of the substrate being a determination object based on the substrate image determined to have no defect at the first determination step.

2. The substrate defect inspection method according to claim 1, wherein
    the predetermined timing is timing when it is determined that there is no defect at the first determination step.

3. The substrate defect inspection method according to claim 1, wherein
    the Zernike coefficients of the pixel value distribution components corresponding to the defects to be detected are of a fourth term, a twelfth term, and a thirteenth term of the Zernike polynomial.

4. The substrate defect inspection method according to claim 3, wherein:
    the first determination step determines the presence or absence of the defect of the substrate based on whether the calculated Zernike coefficient exceed a threshold value; and
    the second determination step sets a reference image from the substrate image determined to have no defect, compares the reference image and the substrate image of the substrate being an inspection object, and determines the presence or absence of the defect based on whether the substrate image falls within an allowable range from the reference image.

5. The substrate defect inspection method according to claim 4, wherein
    the allowable range is corrected based on a difference between the Zernike coefficient and the threshold value.

6. The substrate defect inspection method according to claim 4, wherein
    the reference image is corrected based on a difference between the Zernike coefficient and the threshold value.

7. A non-transitory computer-readable storage medium storing a program running on a computer of a controller controlling a substrate treatment system to cause the substrate treatment system to execute a substrate defect inspection method,
    the substrate defect inspection method being a method for inspecting defects of substrates when executing a job in which a treatment recipe for the substrates and the substrates being treatment objects are designated to perform predetermined treatments on the substrates, the method comprising:
    an imaging step of successively imaging the substrates;
    a first determination step of decomposing, in order from the substrate being a head of the job, a planar distribution of pixel values in a substrate image captured at the imaging step into a plurality of pixel value distribution components using a Zernike polynomial, calculating Zernike coefficients of the pixel value distribution components corresponding to defects to be detected, and determining presence or absence of a defect of the substrate based on the calculated Zernike coefficients; and a second determination step of determining, from predetermined timing after at least one substrate is determined to have no defect at the first determination step, presence or absence of a defect of the substrate being a determination object based on the substrate image determined to have no defect at the first determination step.

8. The non-transitory computer-readable storage medium according to claim 7, wherein the predetermined timing is timing when it is determined that there is no defect at the first determination step.

9. The non-transitory computer-readable storage medium according to claim 7, wherein the Zernike coefficients of the pixel value distribution components corresponding to the defects to be detected are of a fourth term, a twelfth term, and a thirteenth term of the Zernike polynomial.

10. The non-transitory computer-readable storage medium according to claim 9, wherein:

the first determination step determines the presence or absence of the defect of the substrate based on whether the calculated Zernike coefficient exceed a threshold value; and the second determination step sets a reference image from the substrate image determined to have no defect, compares the reference image and the substrate image of the substrate being an inspection object, and determines the presence or absence of the defect based on whether the substrate image falls within an allowable range from the reference image.

11. The non-transitory computer-readable storage medium according to claim 10, wherein the allowable range is corrected based on a difference between the Zernike coefficient and the threshold value.

12. The non-transitory computer-readable storage medium according to claim 10, wherein the reference image is corrected based on a difference between the Zernike coefficient and the threshold value.

13. A substrate defect inspection apparatus for inspecting defects of substrates in a substrate treatment system executing a job in which a treatment recipe for the substrates and a number of substrates to be treated are designated to perform predetermined treatments on the substrates, the substrate defect inspection apparatus comprising:

an imager configured to image the substrates;

a first determiner configured to decompose, in order from the substrate being a head of the job, a planar distribution of pixel values in a substrate image captured in the imager into a plurality of pixel value distribution components using a Zernike polynomial, calculate Zernike coefficients of the pixel value distribution components corresponding to defects to be detected, and determine presence or absence of a defect of the substrate based on the calculated Zernike coefficients; and a second determiner configured to determine from predetermined timing after at least one substrate is determined to have no defect in the first determiner, presence or absence of a defect of the substrate being a determination object based on the substrate image determined to have no defect in the first determiner.

14. The substrate defect inspection apparatus according to claim 13, wherein the predetermined timing is timing when it is determined that there is no defect in the first determiner.

15. The substrate defect inspection apparatus according to claim 13, wherein the Zernike coefficients of the pixel value distribution components corresponding to the defects to be detected are of a fourth term, a twelfth term, and a thirteenth term of the Zernike polynomial.

16. The substrate defect inspection apparatus according to claim 15, wherein:

the first determiner determines the presence or absence of the defect of the substrate based on whether the calculated Zernike coefficient exceed a threshold value; and the second determiner sets a reference image from the substrate image determined to have no defect, compares the reference image and the substrate image of the substrate being an inspection object, and determines the presence or absence of the defect based on whether the substrate image falls within an allowable range from the reference image.

17. The substrate defect inspection apparatus according to claim 16, wherein the allowable range is corrected based on a difference between the Zernike coefficient and the threshold value.

18. The substrate defect inspection apparatus according to claim 16, wherein the reference image is corrected based on a difference between the Zernike coefficient and the threshold value.

\* \* \* \* \*